United States Patent
Asahi et al.

(10) Patent No.: US 7,229,494 B2
(45) Date of Patent: Jun. 12, 2007

(54) PRODUCTION METHOD FOR COMPOUND SEMICONDUCTOR SINGLE CRYSTAL

(75) Inventors: Toshiaki Asahi, Toda (JP); Kenji Sato, Toda (JP); Atsutoshi Arakawa, Atsutoshi (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 252 days.

(21) Appl. No.: 10/502,228

(22) PCT Filed: Dec. 17, 2002

(86) PCT No.: PCT/JP02/13165

§ 371 (c)(1),
(2), (4) Date: Jul. 22, 2004

(87) PCT Pub. No.: WO03/068696

PCT Pub. Date: Aug. 21, 2003

(65) Prior Publication Data

US 2005/0118739 A1   Jun. 2, 2005

(30) Foreign Application Priority Data

Feb. 13, 2002 (JP) ............................. 2002-035551
Jul. 17, 2002 (JP) ............................. 2002-208530
Aug. 29, 2002 (JP) ............................. 2002-249963

(51) Int. Cl.
*C30B 15/20* (2006.01)
(52) U.S. Cl. .............................. 117/13; 117/17; 117/18
(58) Field of Classification Search ................... 117/13, 117/17, 18
See application file for complete search history.

(56) References Cited

U.S. PATENT DOCUMENTS 5,078,830 A * 1/1992 Shirata et al. ................. 117/17
5,290,395 A * 3/1994 Matsumoto et al. .......... 117/17

FOREIGN PATENT DOCUMENTS

| JP | 60-27693 A | 2/1985 |
| JP | 61-26590 A | 2/1986 |
| JP | 62-288193 A | 12/1987 |
| JP | 63-195188 A | 8/1988 |
| JP | 1-294592 A | 11/1989 |
| JP | 7-17792 A | 1/1995 |

* cited by examiner

*Primary Examiner*—Felisa Hiteshew
(74) *Attorney, Agent, or Firm*—Birch, Stewart, Kolasch & Birch, LLP

(57) ABSTRACT

A method for producing a compound semiconductor single crystal by a liquid encapsulated Czochralski method, including containing a semiconductor raw material and an encapsulating material in a raw material melt-containing portion having a first crucible having a bottom and a cylindrical shape and a second crucible disposed within the first crucible and having a communication hole communicating with the first crucible in a bottom portion thereof; melting the raw material by heating the raw material melt-containing portion; and growing a crystal by making a seed crystal contact with a surface of the raw material melt in a state covered with the encapsulating material and by pulling up the seed crystal. A heater temperature is controlled so that a diameter of a growing crystal becomes approximately equal to an inner diameter of the second crucible, and the crystal is grown by maintaining a surface of the growing crystal in a state covered with the encapsulating material until termination of crystal growth.

8 Claims, 1 Drawing Sheet

PRODUCTION METHOD FOR COMPOUND SEMICONDUCTOR SINGLE CRYSTAL

FIELD OF THE INVENTION

The present invention relates to a method for producing a compound semiconductor single crystal, and more particularly, to a technique usefully applied to a method for producing, for example, a ZnTe system compound semiconductor single crystal by the liquid encapsulated Czochralski (LEC) method.

BACKGROUND ART

Presently, a ZnTe system compound semiconductor single crystal is deemed as a promising crystal which can be applied to a pure green light-emitting element.

In general, the ZnTe system compound semiconductor single crystal is produced by a vapor phase epitaxy method in which a ZnTe polycrystal as a raw material disposed at one end in a quartz ampoule is heated to be sublimed at a temperature around a melting point thereof, and a ZnTe single crystal is deposited on a substrate arranged on an opposite side of the ampoule. This method makes it possible to obtain a rectangular ZnTe single crystal substrate of approximately 20 mm×20 mm at the maximum. Recently, to further enhance the light-emitting characteristic of the crystal as a light-emitting element, it has been devised to increase the electrical conductivity of a crystal, and a method of adding an impurity, such as phosphorus, arsenic or the like, to the crystal is carried out, as the method for increasing the electrical conductivity.

Further, it is also possible to make use of the vertical Bridgeman (VB) method or the vertical gradient freezing (VGF) method to grow a ZnTe system compound semiconductor single crystal. In the VB method and the VGF method, since an impurity can be added during crystal growth, these methods are advantageous in that it is easy to control the electrical conductivity of a crystal through addition of an impurity to the crystal. Further, it is also devised to cover the liquid surface of a raw material melt with an encapsulating material so as to prevent an impurity from being mixed into the melt from above to inhibit forming of a single crystal, and to suppress temperature fluctuation in the melt.

However, in the case of growing a ZnTe system compound semiconductor single crystal by the vapor phase epitaxy method, it is difficult to add a desired impurity during crystal growth, and hence difficult to control the resistivity of the ZnTe system compound semiconductor single crystal. Further, in the vapor phase epitaxy method, the growth rate of a ZnTe crystal is extremely slow, and hence it is difficult to obtain a single crystal having a sufficient size, which results in low productivity.

Moreover, even if a relatively large substrate of approximately 20 mm×20 mm can be obtained by growing the ZnTe system compound semiconductor single crystal, the low productivity makes the substrate very expensive, which offers a barrier to development of devices using the ZnTe system compound semiconductor single crystal.

For the above reasons, production of the ZnTe system compound semiconductor single crystal by the vapor phase epitaxy method is not practical as a method for industrial production.

On the other hand, in production of the ZnTe system compound semiconductor single crystal by the VB method or the VGF method, it is possible to grow a large-sized crystal, but since the crystal is grown by being cooled in the state covered by the encapsulating material, a difference in the coefficient of thermal expansion between the encapsulating material and the growing crystal often causes cracking in the crystal.

Further, in the LEC method, similarly to the VB method and the VGF method, it is also possible to add an impurity, and hence the LEC method is advantageous in that it is easy to control the electrical conductivity of a crystal through addition of an impurity to the crystal. However, almost no example has been known so far in which a large-sized ZnTe compound semiconductor single crystal is grown by the LEC method.

An object of the invention is to provide a method for producing a compound semiconductor single crystal, which is capable of growing a large-sized ZnTe system compound semiconductor single crystal or other kinds of compound semiconductor single crystals while maintaining excellent crystal quality.

DISCLOSURE OF THE INVENTION

In order to attain the above object, the present invention provides a method for producing a compound semiconductor single crystal by a liquid encapsulated Czochralski method, comprising: containing a semiconductor raw material and an encapsulating material in a raw material melt-containing portion comprising a first crucible and a second crucible, the first crucible having a bottom and a cylindrical shape, and the second crucible being disposed in an inside of the first crucible and having a bottom portion thereof provided with a communication hole communicating with the first crucible; melting the raw material by heating the raw material melt-containing portion; and growing a crystal by making a seed crystal be in contact with a surface of the raw material melt in a state covered with the encapsulating material and by pulling up the seed crystal, wherein a heater temperature is controlled so that a diameter of a growing crystal becomes approximately equal to an inner diameter of the second crucible, and the crystal is grown by maintaining a surface of the growing crystal in a state covered with the encapsulating material until termination of crystal growth.

According to this method, since components can be prevented from being evaporated from the crystal surface, a temperature gradient in the encapsulating material can be made extremely small, and a crystal having excellent quality can be grown. Further, it is possible to suppress temperature fluctuation in the raw material melt by reducing the temperature gradient in the encapsulating material, so that even with a material, such as ZnTe or the like, which is conventionally considered to be difficult to obtain a single crystal, it is possible to grow a single crystal from a seed crystal thereof.

Furthermore, the diameter of the growing crystal can be made approximately equal to the inner diameter of the second crucible by controlling the heater temperature. Therefore, it is possible to easily obtain a single crystal having a desired diameter, and moreover, it is possible to basically dispense with a relatively complicated temperature control program or the like for controlling the diameter of the growing crystal.

Further, an amount of the encapsulating material to be added may be set to an amount such that the encapsulating material is capable of filling a space generated between the growing crystal and the second crucible in accordance with the crystal growth and covering an entire surface of the growing crystal. In other words, the amount of the encapsulating material to be added is adjusted such that even after the encapsulating material fills the space generated between the growing crystal and the second crucible, the encapsulating material remains on the upper surface of the growing crystal. Thereby, since the growing crystal is held in a state positively covered with the encapsulating material, component elements of the growing crystal will not be evaporated.

Further, a crucible having a tapered structure in which an inner diameter of a bottom portion of the crucible is smaller than an inner diameter of a top portion of the crucible may be used as the second crucible. This makes the diameter of the growing crystal being pulled upward smaller than the inner diameter of a portion of the second crucible at a corresponding position. Therefore, since the growing crystal is prevented from being brought into contact with the crucible wall surface, except at a growth interface, it becomes possible to obtain a crystal excellent in quality.

Further, it is preferred that the second crucible has a side face thereof tilted with respect to a vertical direction within a range of 0.2° to 10°. This makes the volume of the space generated between the growing crystal and the second crucible relatively small, so that it is possible to cover the entire surface of the growing crystal with the encapsulating material without using an extremely large amount of the encapsulating material.

Further, the crystal growth may be performed in a state of the second crucible being dipped in the raw material melt contained in the first crucible to a depth within a range of 10 mm to 40 mm, and a diameter of the communication hole may be not more than 1/5 of the inner diameter of the second crucible. Thereby, since it is possible to efficiently suppress temperature fluctuation in the raw material melt in the second crucible, a single crystal having excellent quality can be grown. In addition, since the communication path communicating with the first crucible is limited, even when a contaminant or the like has mixed into the raw material melt in the second crucible, it is possible to remove the contaminant from the second crucible into the first crucible by pulling up the second crucible, to thereby prevent the contaminant from being mixed into the crystal being grown.

Furthermore, although a difference in the concentration of the impurity in the raw material melt is caused between the first crucible and the second crucible when an impurity as a dopant is added to the raw material melt, it becomes possible to control the difference in the concentration of the impurity in the melt and keep constant the concentration of the impurity in the raw material melt in the second crucible by modifying the size of the communication hole of the second crucible under the condition of the size not more than 1/5 of the inner diameter of the second crucible.

Further, a temperature gradient in the raw material melt may be set to at least not more than 20° C./cm, whereby it is possible to prevent a polycrystal or a twin crystal from occurring. It should be noted that since the growing crystal is always covered with the encapsulating material, even if the temperature gradient is reduced, there is no fear of decomposition of the growing crystal.

BEST MODE FOR CARRYING OUT THE INVENTION

Hereinafter, a preferred embodiment of the present invention will be explained with reference to the drawings.

Figure 1:
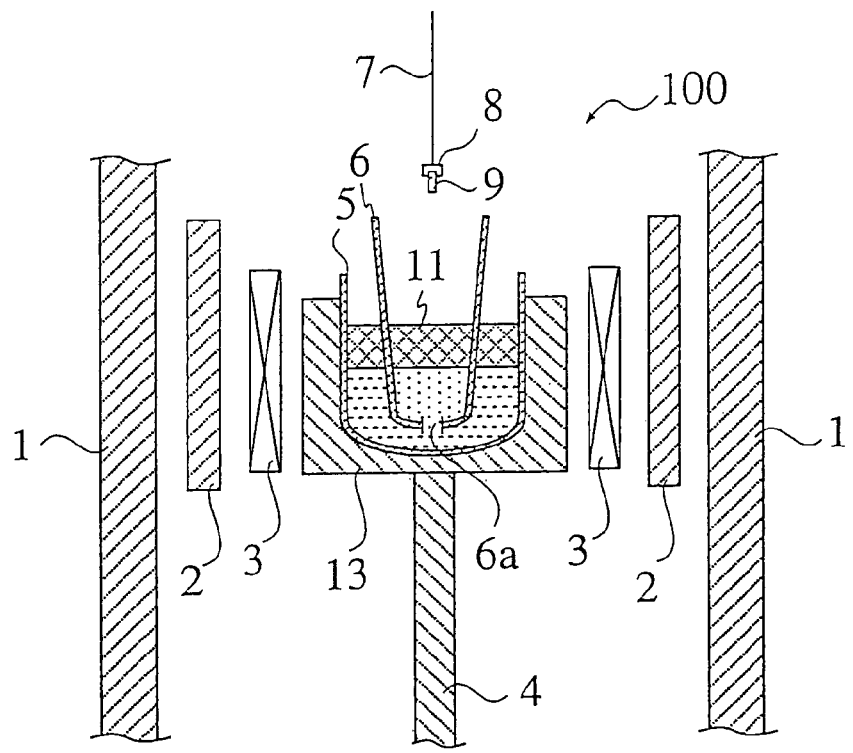
FIG. 1 is a view schematically showing the arrangement of a crystal growth apparatus used in an embodiment of the present invention.
Figure 2:
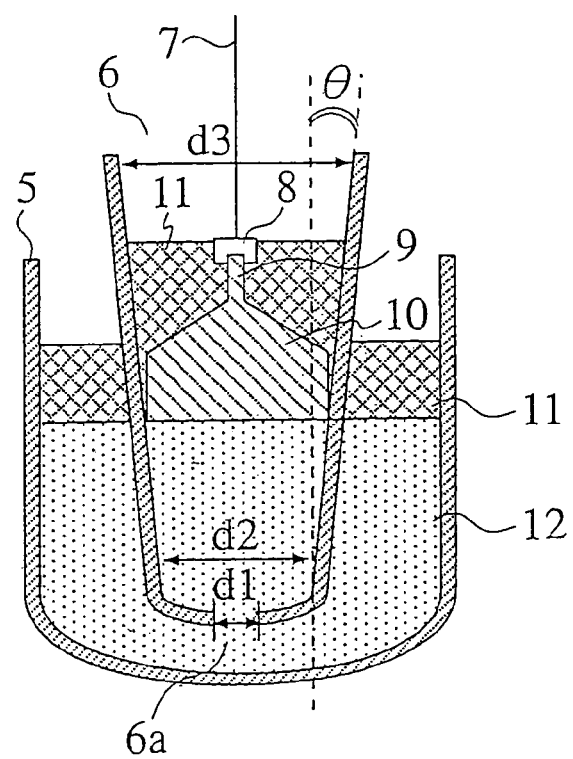
FIG. 2 is an enlarged view showing a raw material melt-containing portion of the crystal growth apparatus shown in FIG. 1.

FIG. 1 is a view schematically showing the arrangement of an embodiment of a crystal growth apparatus according to the present invention, and FIG. 2 is an enlarged view showing a raw material melt-containing portion.

The crystal growth apparatus 100 comprises a high pressure container 1, a thermal insulation member 2 and a heater 3 arranged within the high pressure container 1 concentrically with the same, a rotating shaft 4 arranged vertically in a central portion of the high pressure container 1, a susceptor 13 arranged on the upper end of the rotating shaft 4, a pBN outer crucible (first crucible) 5 having a bottom and a cylindrical shape and fitted in the susceptor, a pBN inner crucible (second crucible) 6 arranged within the outer crucible 5, and a rotating lift shaft 7 vertically arranged above the inner crucible 6 and having a seed crystal holder 8 attached to the lower end thereof, for holding a seed crystal 9.

The inner crucible 6 has a bottom surface thereof formed with a communication hole 6a which communicates with the outer crucible 5, and a raw material melt 12 can move from the outer crucible 5 to the inner crucible 6 via the communication hole 6a. It should be noted that the inner crucible 6 is fixed to the outer crucible 5 or a jig other than the outer crucible 5 by a suitable holder (not shown).

Further, the inner crucible 6 has a tapered structure in which an inner diameter of a bottom portion thereof is smaller than an inner diameter of a top portion thereof, and hence the diameter of a growing crystal being pulled upward becomes smaller than that of the second crucible at a corresponding position, which prevents the growing crystal from being brought into contact with the wall surface of the second crucible, except at a growth interface of the growing crystal. Further, it is preferred that the inner crucible has a side face thereof tilted with respect to the vertical direction within an range of 0.2° to 10° to form a taper, so as to make the volume of a space generated between the growing crystal and the second crucible during crystal growth relatively small to thereby reduce the amount of the encapsulating material entering the space.

The rotating lift shaft 7 is connected to a driving portion (not shown), arranged outside the high pressure container, to form a rotating lift mechanism. The rotating shaft 4 is connected to a driving portion (not shown), arranged outside the high pressure container 1, to form a crucible-rotating mechanism as well as a susceptor-lifting mechanism. It should be noted that the rotational motion and the lifting motion of the rotating lift shaft 7 and the crucible-rotating shaft 4 are set and controlled independently of each other.

By using the crystal growth apparatus described above, it is possible to pull a single crystal rod grown from the seed crystal while rotating the same, and thereby grow a highly pure single crystal at the lower end thereof by the liquid encapsulated Czochralski method.

Next, a method for producing a ZnTe compound semiconductor single crystal, as an example of a compound semiconductor, by using the crystal growth apparatus 100 will be described in detail.

In the embodiment, the outer crucible 5 is implemented by a pBN crucible having a size of 100 mmφ in inner diameter× 100 mm in height×1 mm in thickness, while the inner crucible 6 is implemented by a pBN crucible having a tapered structure and a size of 54 mmφ (bottom portion d2)

to 56 mmφ (top portion d3) in inner diameter×100 mm in height×1 mm in thickness. In this case, the tilt angle θ of the side face of the inner crucible 6 is approximately 0.57° with respect to the vertical direction.

The communication hole 6a having a diameter (d1) of 10 mm is formed in the central portion of the bottom surface of the inner crucible 6. It should be noted that the size of the communication hole 6a is not limited to 10 mm, but the communication hole 6a may be formed to have any size so long as the size not more than ⅕ of the inner diameter of the inner crucible 6.

First, Zn having a purity of 6N and Te having a purity of 6N as raw materials were placed in the outer crucible 5 and the inner crucible 6 in a total amount of 1.5 kg such that they were equimolar, and the raw materials were covered with 400 g of an encapsulating material ($B_2O_3$) 11 to form an encapsulating material layer having a thickness of 35 mm. It should be noted that after melting the raw materials by the heater 3, the inner crucible 6 was fixed by a holder such that it was in a state dipped in the raw material melt to a depth of 20 mm from the liquid surface of the raw material melt. Further, while the raw material melt gradually decreased with crystal growth, the dipped state of the inner crucible 6 was controlled by lifting the rotating shaft 4 to move upward the susceptor 13 (outer crucible 5). For instance, the inner crucible 6 was held in a state dipped in the raw material melt to a depth within a range of 10 to 40 mm from the liquid surface of the raw material melt.

Next, the crucibles 5 and 6 were disposed on the susceptor 13, and the high pressure container 1 was filled with an inert gas (for example, Ar) so that the pressure within the high pressure container 1 would be adjusted to a predetermined pressure. Then, the crucibles 5 and 6 were heated by the heater 3 at a predetermined temperature, with the surfaces of the raw materials held down by the encapsulating material, so that Zn and Te were melted and synthesized directly.

Then, after the raw material melt has been held for a predetermined time in the melted state, the seed crystal 9 was brought into contact with the surface of the raw material melt. Here, a seed crystal having a (100) crystal orientation was used as the seed crystal. Further, the seed crystal 9 was covered by a cover made from molybdenum (not shown), for prevention of decomposition thereof.

Thereafter, the rotating lift shaft 7 was rotated at a rotational speed of 1 to 2 rpm and pulled up at a rate of 2.5 mm/h to form a shoulder portion of the crystal. Subsequently, after the shoulder portion was formed, the crucible-rotating shaft was rotated at a rotational speed of 1 to 5 rpm and pulled up at a rate of 2.5 mm/h to form a body portion of the crystal. In this case, the diameter of the body portion of the growing crystal 10 was approximately the same as the inner diameter of the inner crucible 6 as shown in FIG. 2. Therefore, it was possible to obtain a crystal having a desired diameter easily without executing complicated diameter control by the pulling rate and the rotational speeds of the crucibles and the rotating lift shaft.

Further, since the inner crucible 6 is formed to have the tapered structure, it was possible to prevent the growing crystal 10 from being brought into contact with the crucible wall surface at any other portion than the growth interface when the growing crystal 10 was pulled upward in accordance with crystal growth. More specifically, as shown in FIG. 2, a gap was formed between the growing crystal 10 and the inner crucible 6, and the encapsulating material entered the gap to cover the surface of the growing crystal. Thereby, it was possible to prevent the growing crystal from being brought into contact with the wall surface of the inner crucible 6 to cause deterioration of crystal quality.

Moreover, since the gap between the growing crystal 10 and the inner crucible 6 was small, the amount of encapsulating material 11 in the top portion of the crystal moved into the gap was small, and hence the crystal surface was always held in the state covered with the encapsulating material 11. Thereby, since component elements of the growing crystal 10 was prevented from being evaporated, and a temperature gradient in the encapsulating material could be made extremely small a grown crystal excellent in quality could be obtained.

Although in the present example, the tilt angle θ of the side face of the inner crucible 6 with respect to the vertical direction is set to 0.57°, the tilt angle may be within a range of 0.2° to 10°.

Further, from the fact that the temperature fluctuation in the raw material melt in the inner crucible 6 was approximately 0.5° C., and that the temperature fluctuation in the raw material melt between the inner crucible 6 and the outer crucible 5 was approximately 1 to 2° C., it could be confirmed that the double crucible structure made it possible to suppress temperature fluctuation in the inner crucible 6. Furthermore, the temperature gradient in the raw material melt during crystal growth was not more than 10° C./cm, and since the surface of the growing crystal 10 was always covered with the encapsulating material 11, no decomposition of the crystal occurred.

The crystal growth was performed by the liquid encapsulated Czochralski method as described above, and after the crystal having been grown, the grown crystal 10 was separated from the encapsulating material 11, whereby ZnTe compound semiconductor crystal without any crack was obtained. The obtained ZnTe compound semiconductor crystal was an extremely excellent single crystal without any polycrystal or twin crystal. Further, the grown crystal had a size of 54 mmφ in diameter×60 mm in length, which means that an increase in the size of the ZnTe system compound semiconductor crystal, conventionally considered to be difficult to attain, could be realized.

In the above, the present invention is explained in detail on the basis of the example made by the present inventors. However, the present invention is not limited to the above-described example.

For instance, in the above-described embodiment, the inner crucible 6 has the bottom surface thereof formed with the single communication hole having a diameter of 10 mmφ. However, the number of communication hole is not limited to one, but even if a plurality of communication holes are provided, it is considered possible to obtain effects, such as suppressing temperature fluctuation, and the like.

Further, by adding an impurity as a dopant in the raw material melt, it is possible to easily control the electrical conductivity of the crystal. In this case, although a difference in the concentration of the impurity in the raw material melt is caused between in the outer crucible 5 and in the inner crucible 6, it becomes possible to control the difference in the concentration of the impurity in the raw material melt between the two crucibles and keep constant the concentration of the impurity in the raw material melt in the inner crucible 6 by modifying the size of the communication hole formed in the second crucible within a range of not more than ⅕ of the inner diameter of the second crucible.

According to the present invention, the method for producing a compound semiconductor single crystal by a liquid encapsulated Czochralski method, comprises: containing a semiconductor raw material and an encapsulating material in a raw material melt-containing portion comprising a first crucible and a second crucible, the first crucible having a bottom and a cylindrical shape, and the second crucible being disposed in an inside of the first crucible and having a bottom portion thereof provided with a communication hole communicating with the first crucible; melting the raw material by heating the raw material melt-containing portion; and growing a crystal by making a seed crystal be in contact with a surface of the raw material melt in a state covered with the encapsulating material and by pulling up the seed crystal. A heater temperature is controlled so that a diameter of a growing crystal becomes approximately equal to an inner diameter of the second crucible, and the crystal is grown by maintaining a surface of the growing crystal in a state covered with the encapsulating material until termination of crystal growth. This makes it possible to easily obtain a crystal having a desired diameter without executing complicated diameter control, and prevent evaporation of component elements from the crystal surface during crystal growth, thereby growing a crystal excellent in quality.

Moreover, the double-crucible structure makes it possible to suppress temperature fluctuation in the raw material melt received in the crucibles, so that production of a twin crystal and a polycrystal can be prevented, so that an extremely excellent crystal can be obtained.

INDUSTRIAL APPLICABILITY

The present invention is by no means limited to the producing of a ZnTe compound semiconductor single crystal, but it can be applied to producing of not less than ternary ZnTe system compound semiconductor single crystals containing ZnTe or other compound semiconductor single crystals.

The invention claimed is:

1. A method for producing a compound semiconductor single crystal by a liquid encapsulated Czochralski method, comprising:
    containing a semiconductor raw material and an encapsulating material in a raw material melt-containing portion comprising a first crucible and a second crucible,
the first crucible having a bottom and a cylindrical shape, and the second crucible being disposed in an inside of the first crucible and having a bottom portion thereof provided with a communication hole communicating with the first crucible;
    melting the raw material by heating the raw material melt-containing portion; and
    growing a crystal by making a seed crystal be in contact with a surface of the raw material melt in a state covered with the encapsulating material and by pulling up the seed crystal,
    wherein a crucible having a tapered structure in which an inner diameter of a bottom portion of the crucible is smaller than an inner diameter of a top portion of the crucible and in which a side face thereof tilted with respect to a vertical direction within a range of 0.2° to 10° C., and a diameter of a communication hole may be not more than ⅕ of the inner diameter of the crucible may be used as the second crucible, and
    when the body of a crystal is grown, a heater temperature is controlled so that on an interface between a growing crystal and the raw material melt, the crystallization is advanced until reaching an inner wall of the second crucible, and the crystallization is done in such a way that a diameter of the body of the growing crystal is consistent with an inner diameter of the second crucible on the interface and the diameter of the body of the growing crystal is confined by the inner wall of the second crucible, while the crystal is grown by maintaining a surface of the growing crystal in a state covered with the encapsulating material until termination of crystal growth.

2. The method for producing a compound semiconductor single crystal as claimed in claim 1, wherein an amount of the encapsulating material to be added is set to an amount such that the encapsulating material is capable of filling a space generated between the growing crystal and the second crucible in accordance with the crystal growth and covering an entire surface of the growing crystal.

3. The method for producing a compound semiconductor single crystal as claimed in claim 1, wherein the crystal growth is performed in a state of the second crucible being dipped in the raw material melt contained in the first crucible to a depth within a range of 10 mm to 40 mm.

4. The method for producing a compound semiconductor single crystal as claimed in claim 2, wherein the crystal growth is performed in a state of the second crucible being dipped in the raw material melt contained in the first crucible to a depth within a range of 10 mm to 40 mm.

5. The method for producing a compound semiconductor single crystal as claimed in claim 1, wherein a temperature gradient in the raw material melt is set to at least not more than 20° C./cm.

6. The method for producing a compound semiconductor single crystal as claimed in claim 2, wherein a temperature gradient in the raw material melt is set to at least not more than 20° C./cm.

7. The method for producing a compound semiconductor single crystal as claimed in claim 3, wherein a temperature gradient in the raw material melt is set to at least not more than 20° C./cm.

8. The method for producing a compound semiconductor single crystal as claimed in claim 4, wherein a temperature gradient in the raw material melt is set to at least not more than 20° C./cm.

* * * * *